United States Patent
Cheung et al.

(10) Patent No.: US 7,665,204 B2
(45) Date of Patent: Feb. 23, 2010

(54) DIE DETACHMENT APPARATUS COMPRISING PRE-PEELING STRUCTURE

(75) Inventors: Yiu Ming Cheung, Hong Kong (CN); Shiqiang Yao, Hong Kong (CN); Gary Peter Widdowson, Hong Kong (CN)

(73) Assignee: ASM Assembly Automation Ltd., Hong Kong (HK)

( * ) Notice: Subject to any disclaimer, the term of this patent is extended or adjusted under 35 U.S.C. 154(b) by 23 days.

(21) Appl. No.: 11/582,055

(22) Filed: Oct. 16, 2006

(65) Prior Publication Data

US 2008/0086874 A1  Apr. 17, 2008

(51) Int. Cl.
  *B23P 19/00* (2006.01)
  *B29C 1/00* (2006.01)
  *B29C 63/00* (2006.01)

(52) U.S. Cl. .............................. 29/762; 29/743; 29/739; 156/344; 156/584

(58) Field of Classification Search .................. 29/743, 29/739, 740, 762, 426.3, 426.5; 156/344, 156/584; 438/464, 976
See application file for complete search history.

(56) References Cited

U.S. PATENT DOCUMENTS

| | | | |
|---|---|---|---|
| 4,850,780 A * | 7/1989 | Safabakhsh et al. | 414/416.1 |
| 4,990,051 A * | 2/1991 | Safabakhsh et al. | 156/344 |
| 5,367,858 A * | 11/1994 | Haasl | 53/439 |
| 6,201,306 B1 * | 3/2001 | Kurosawa et al. | 257/783 |
| 6,386,815 B1 * | 5/2002 | Tawara | 414/416.1 |
| 6,505,395 B1 * | 1/2003 | Farnworth et al. | 29/559 |
| 6,561,743 B1 * | 5/2003 | Nakatsu | 414/403 |
| 6,774,011 B2 * | 8/2004 | Nakazawa et al. | 438/464 |
| 6,889,427 B2 * | 5/2005 | Yee et al. | 29/832 |
| 6,943,094 B2 * | 9/2005 | Koopmans | 438/462 |
| 7,240,422 B2 * | 7/2007 | Cheung et al. | 29/762 |
| 2003/0154597 A1 * | 8/2003 | Yee et al. | 29/832 |
| 2006/0137828 A1 * | 6/2006 | Fujisawa et al. | 156/584 |

* cited by examiner

*Primary Examiner*—A. Dexter Tugbang
*Assistant Examiner*—David P Angwin
(74) *Attorney, Agent, or Firm*—Ostrolenk Faber LLP

(57) ABSTRACT

An apparatus and method are provided for detaching a die from an adhesive film, the apparatus comprising a vacuum platform having a surface configured to support a part of the adhesive film on which the die is attached. A plurality of pre-peeling columns having substantially flat contact surfaces are projectable relative to the surface of the vacuum platform to push against the adhesive film at the position of the die to generate initial peeling between the die and the adhesive film. Thereafter, a plurality of ejector pins that are positionable relative to the pre-peeling columns are operative to push against the adhesive film at the position of the die to generate further peeling between the die and the adhesive film. The die is then removed from the adhesive film.

12 Claims, 8 Drawing Sheets

Gap between the adhesive film and the platform

Vacuum suction

DIE DETACHMENT APPARATUS COMPRISING PRE-PEELING STRUCTURE

FIELD OF THE INVENTION

The invention relates to the handling of a semiconductor chip or semiconductor die during semiconductor assembly and packaging, and in particular to the detachment of a semiconductor die from an adhesive film on which it is mounted.

BACKGROUND AND PRIOR ART

Typically, a wafer comprising a plurality of semiconductor dice are mounted on an adhesive film during singulation wherein each individual die is separated while it adheres to the adhesive film. Detaching a die from an adhesive film is thus a common process involved in die bonding and flip chip bonding processes for assembling an electronic package. One trend for the development of high density electronic devices is to multiply its density on the same footprint by stacking up the dice comprised in an electronic package. The thickness of each die being stacked in the package has to be reduced in order to minimize the final height of the package. It becomes a challenging task to detach a die from an adhesive film without damaging the die when the thickness of the die is reduced to below 4 mils (about 100 microns). Dice with thickness of 3-4 mils (75-100 microns) have been used for mass production for some time. Mass production of dice at 2-3 mils (50-75 microns) thick is currently under preparation. Experiments for research and development in electronic packaging designs are ongoing for dice of 1-2 mils (25-50 microns) thick. Hence, an apparatus that is capable of reliably detaching very thin dice from adhesive films is becoming a critical component in electronic assembly equipment.

There are various forms of ejector pin designs for facilitating detachment of a die from an adhesive film to which it is mounted. The simplest is a single ejector pin design, which is a traditional design for detaching a small die from an adhesive film. As the size of the die gets bigger (say, more than 4×4 mm), multiple ejector pins may instead be used for detaching the die from the adhesive film.

In U.S. Pat. No. 6,386,815 entitled "Pick-Up Apparatus for Semiconductor Chips", a multiple ejector pins design is disclosed comprising an integrated or a separately rotatable composite cam formed by a plurality of cams and a plurality of pin holders having a plurality of ejector pins, wherein at least a part of the pin holder is in contact with the composite cam. Two sets of multiple ejector pins are mounted on the same set of holders that are capable of providing different pin arrangement configurations. This aids in avoiding conversion time that is otherwise necessary for setting up different pin arrangements as the same pin holders capable of providing two sets of pin arrangements for handling dice of different sizes can be used for detaching dice from the adhesive film. The same pin holders can be used for dice of various sizes in accordance with those pin arrangements without replacing the pin holder.

Another design is disclosed in U.S. Pat. Nos. 4,850,780 and 4,990,051 for a "Pre-Peel Die Ejector Apparatus", wherein a single ejector pin is incorporated with a die eject collar around the ejector pin. The pre-peeling collar is first moved to stretch the adhesive tape to pull it away from the die to be detached, and the die is subsequently further separated from the adhesive tape by the single ejector pin. This design can be used to detach somewhat larger dice from adhesive films.

Yet another approach is described in U.S. Pat. No. 6,201,306 entitled "Push-Up Pin of a Semiconductor Element Pushing-Up Device, and a Method for Separating". This approach utilizes multiple ejector pins with their tips modified to spherical shapes, in order to reduce localized stress acting on the die by the ejector pins during the push-up action.

As can be observed from the above prior art examples, conventional multiple ejector pin assemblies may comprise one or more ejector pins mounted on a pin holder having one or more stages. The target die attached on an adhesive film will be positioned to the center of a vacuum enclosure which contains the ejector pin assembly. Before the ejector pins move up to push against the die through the deformable adhesive film, vacuum suction will be applied within the vacuum enclosure. The suction will hold the adhesive film down onto the top platform of the vacuum enclosure via the vacuum holes on the platform. The adhesive film carrying the die lies flat on top of the platform under compression by atmospheric pressure. The ejector pins will then elevate from below and rise above the top surface of the platform, so that the pins will push the die up and induce a bending moment on the die in order to separate the adhesive film from the die.

The localized stress from the ejector pins acting on the die can be quite high. The push-up action of the ejector pins will induce relatively large deformations on the die at the locations right above the pins. This may cause die crack failure if the induced strain exceeds its critical value. On the other hand, the bending moment on the die will induce a peeling stress along the interface between the die and the adhesive film. This peeling stress will be increased with the bending moment as the ejector pins are pushed further up. If the peeling stress is large enough to overcome the adhesion between the die and the adhesive film, the die will eventually detach from the adhesive film.

The multiple ejector pins are usually arranged in such a way that they are distributed evenly covering most of the die so that the induced stress can be distributed evenly. The number of pins should be optimized so that the die will be almost totally detached from the adhesive film with the exception of residual contact areas where the pins are supporting the die at the end of the push-up motion of the pins. If the number of pins is increased or pins with spherical tips are used, the total contact area will be large and it will jeopardize the successfulness of the die pick-up process. This contact area can be reduced if fewer ejector pins and/or ejector pins with smaller pin tip radii are used. If the radius of the pin tip is smaller, then the stress on the bottom surface of the die will be increased and the induced strain on the top surface of the die at the location right above the ejector pin will also be increased. The bending moment and the induced strain on the top surface of the die will be correspondingly increased if the thickness of the die is reduced.

Therefore, a shortcoming of prior art ejector pin assemblies is that compromises must often be made between the number of ejector pins and the geometry of the pin tips being used in order to minimize the contact area at the end of the push-up motion of the pins, and to even out the induced stress on the die during the push-up motion of the pins. Nevertheless, such compromise may not be easily achievable if the thickness of the die is decreased to less than 4 mils or if the adhesive strength of the adhesive film is larger than 20 J/m$^2$.

SUMMARY OF THE INVENTION

Thus, it is an object of the invention to seek to provide an apparatus and method to detach a die from an adhesive film to which it is attached which avoids some of the aforesaid disadvantages of the prior art. It is another object of the invention to provide an ejector tool with independently drivable components that provide differently configured contact surfaces for promoting peeling of a die so as to avoid die crack failure.

According to a first aspect of the invention, there is provided an apparatus for detaching a die from an adhesive film, comprising: a vacuum platform having a surface configured to support a part of the adhesive film on which the die is attached; a plurality of pre-peeling columns having substantially flat contact surfaces that are projectable relative to the surface of the vacuum platform to push against the adhesive film at the position of the die to generate initial peeling between the die and the adhesive film; and a plurality of ejector pins that are positionable relative to the pre-peeling columns and are operative to push against the adhesive film at the position of the die to generate further peeling between the die and the adhesive film prior to removal of the die from the adhesive film.

According to a second aspect of the invention, there is provided a method for detaching a die from an adhesive film, comprising the steps of: supporting a part of the adhesive film on which the die is attached with a surface of a vacuum platform; projecting a plurality of pre-peeling columns having substantially flat contact surfaces relative to the surface of the vacuum platform to push against the adhesive film at the position of the die to generate initial peeling between the die and the adhesive film; positioning a plurality of ejector pins relative to the pre-peeling columns to push against the adhesive film at the position of the die to generate further peeling between the die and the adhesive film; and thereafter removing the die from the adhesive film.

It will be convenient to hereinafter describe the invention in greater detail by reference to the accompanying drawings. The particularity of the drawings and the related description is not to be understood as superseding the generality of the broad identification of the invention as defined by the claims.

BRIEF DESCRIPTION OF THE DRAWINGS

An example of a die detachment apparatus in accordance with the invention will now be described with reference to the accompanying drawings, in which.

DETAILED DESCRIPTION OF THE PREFERRED EMBODIMENT OF THE INVENTION

Figure 1:
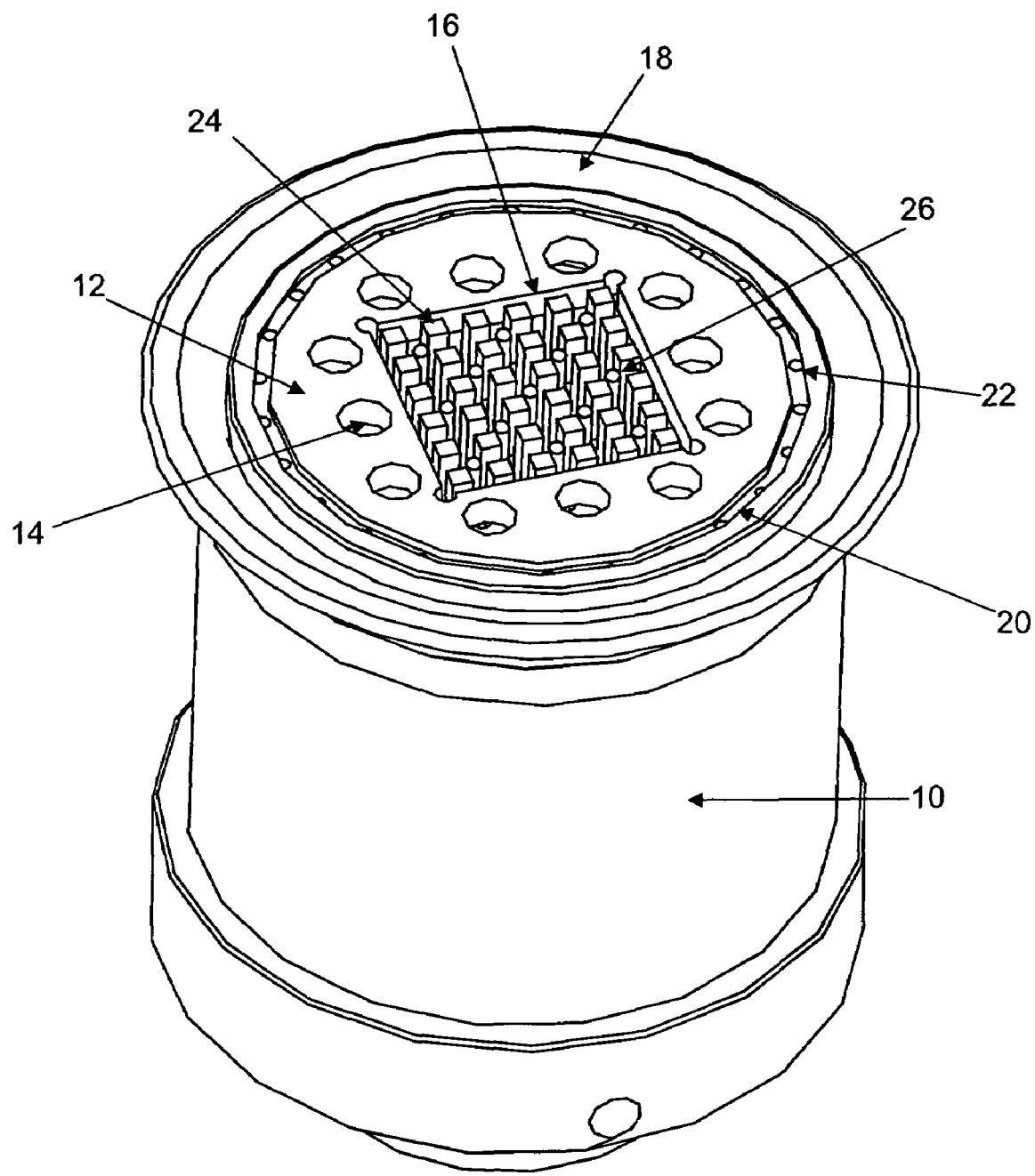
FIG. 1 is an isometric view of a vacuum enclosure of a die detachment apparatus according to the preferred embodiment of the invention.

FIG. 1 is an isometric view of a vacuum enclosure 10 of a die detachment apparatus according to the preferred embodiment of the invention. The vacuum enclosure 10 comprises a cylindrical container having a flat top vacuum platform 12 having a surface configured to support a part of an adhesive film to which a die is attached. It may be mounted to a fixed non-movable base. There are multiple vacuum holes 14 and a central opening 16 on the vacuum platform 12 allowing vacuum suction from inside the vacuum enclosure 10 to apply a vacuum suction force on an adhesive film supported on the vacuum platform 12 to draw it towards the vacuum platform 12. The central opening 16 preferably has a shape that conforms to a shape of the die, which is typically rectangular or square in shape. Vacuum sealing of an interface between the vacuum platform 12 and adhesive film is made possible by a sealing ring 18 on top of the vacuum enclosure 10 together with a vacuum slot 20 and peripheral vacuum holes 22 around the periphery of the vacuum platform 12.

An ejector tool associated with the vacuum enclosure 10 preferably comprises a pre-peeling structure and ejector pins 26. The central opening 16 is sized and configured to allow both the pre-peeling structure and the ejector pins 26 to project from underneath the vacuum platform 12 to push against the adhesive film. The pre-peeling structure, which may be in the form of multiple flat-top pre-peeling columns 24, can project relative to the surface of the vacuum platform 12 to rise above the vacuum platform 12 through the central opening 16. Similarly, the multiple ejector pins 26 which are positioned inside the pre-peeling columns 24 can further project relative to the pre-peeling columns 24 to rise above the vacuum platform 12 and pre-peeling columns 24 through the central opening 16. This latter motion is operative to generate further peeling between the die and the adhesive film.

The multiple pre-peeling columns 24 are mounted on a first stage and are preferably arranged in a matrix configuration and configured such that an area covered by these columns is smaller than the surface area of the die to be detached. All the columns 24 are located inside the die and the outermost columns are aligned and located in close proximity to the corners and edges of the die. The outermost pre-peeling columns are preferably configured to be located substantially at the corners of the die during peeling. The outer edges of these columns 24 are preferably positioned 0.3-1 mm from the edges of the die. The size of the flat top for each pre-peeling column 24 is preferably at least 0.5 mm$^2$ in order to ensure that there is no localized stress induced to the die during the push-up action of the multiple pre-peeling columns 24. There are large enough spacings (at least 1 mm) in-between the pre-peeling columns 24 to allow the propagation of the induced delamination between the die and the adhesive film. These spacings also allow vacuum suction to be applied to the adhesive film in-between the columns 24.

The multiple ejector pins 26 are mounted on a second stage and are evenly distributed and positioned inside the die and the pre-peeling columns 24. The number of multiple ejector pins 26 can be minimized having the closest pin-to-pin distance in a range of 2 to 3 mm. The tip radius of each ejector pin is preferably at least 0.25 mm. Using these design rules to make the tools, a very thin die of thickness less than 4 mils can be detached from an adhesive film of adhesive strength up to 20 J/m$^2$.

Figure 2:
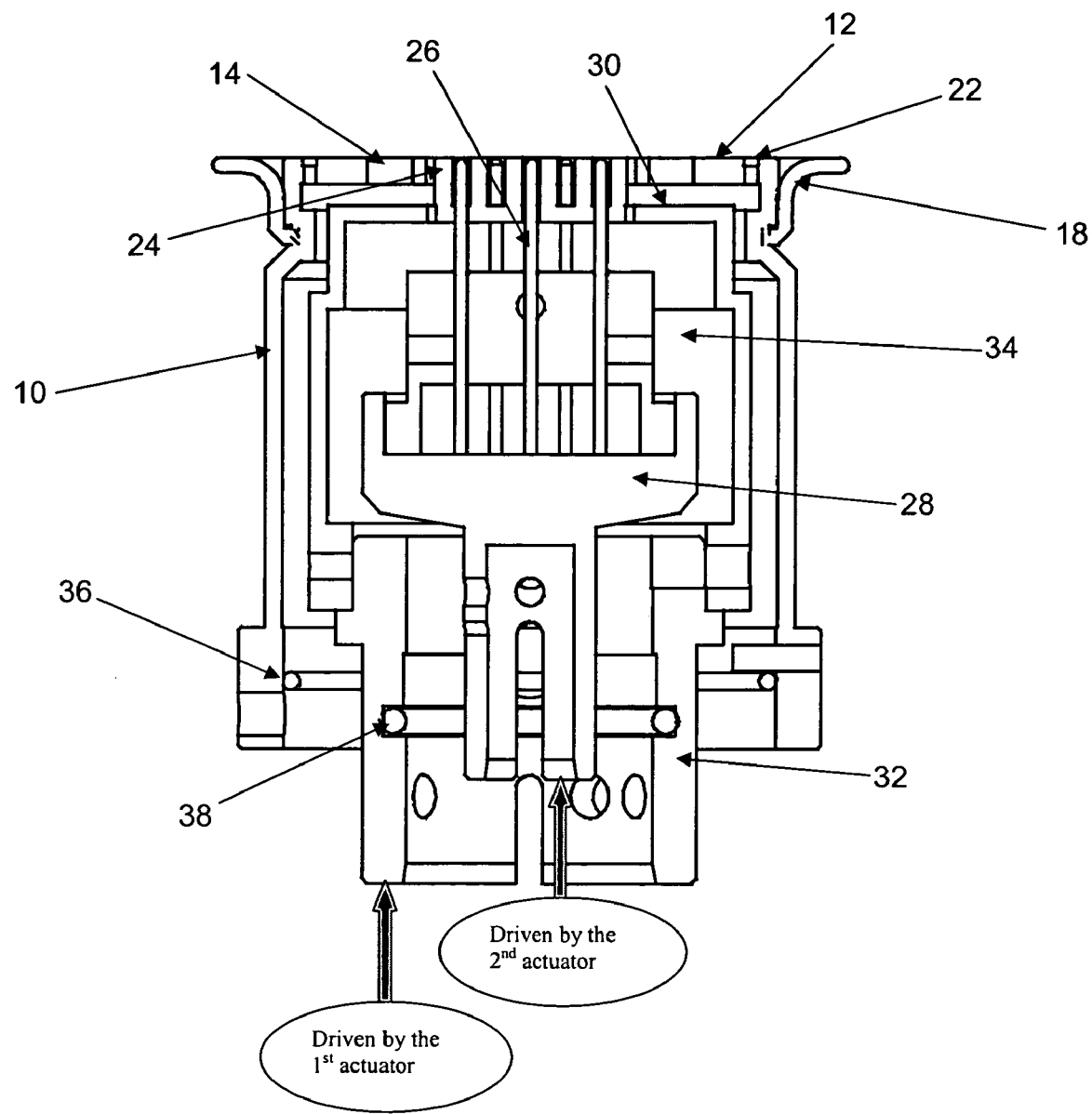
FIG. 2 is a cross-sectional view of the vacuum enclosure of FIG. 1.

FIG. 2 is a cross-sectional view of the vacuum enclosure of FIG. 1. It shows a cylinder 30 containing the multiple pre-peeling columns 24 and a pin chuck 28 holding multiple ejector pins 26 residing inside the vacuum enclosure 10.

The first and second stages are respectively connected to and are independently drivable by two separate actuators, preferably linear actuators coupled to the first and second stages, which may comprise linear servo motors. Therefore, the two stages can move independently to position the ejector tool 24, 26 at pre-determined heights and facilitate various motion sequences of the stages at programmable speeds for the die detachment process. The motion sequences, motion speeds and the vertical heights of the stages can be programmed by programming the linear actuators in accordance with the requirements of the die detachment process. These two movable stages facilitate different methods of operating the multiple pre-peeling columns 24 for pre-peeling the die and to use the multiple ejector pins 26 to complete the delamination between the die and the adhesive film.

The first movable stage includes the multiple pre-peeling columns 24 which protrude from the top surface of the cylinder 30 containing the pre-peeling columns 24. This cylinder 30 is mounted on a mounting bracket 32 for the first actuator and it is driven by the first actuator through a post 44 of the first actuator underneath the mounting bracket 32. The second movable stage includes the pin chuck 28 carrying the multiple ejector pins 26 driven by the second actuator through a post 50 of the second actuator via a mounting rod 51 underneath the pin chuck 28.

Figure 3:
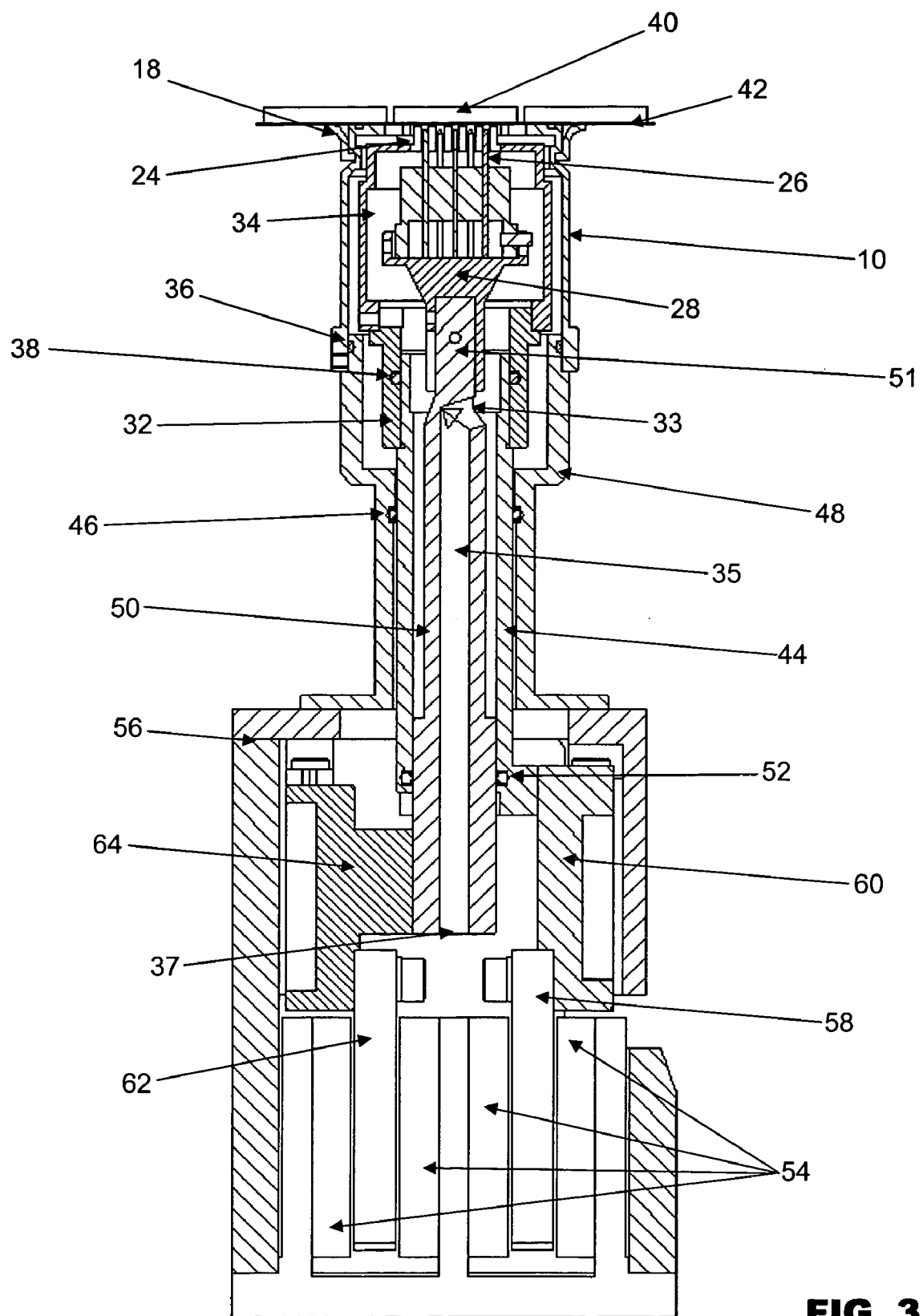
FIG. 3 is a cross-sectional view of the die detachment apparatus including the vacuum enclosure as well as actuators for operating a pre-peeling structure and ejector pins of an ejector tool.

FIG. 3 is a cross-sectional view of the die detachment apparatus including the vacuum enclosure 10 as well as actuators for operating a pre-peeling structure in the form of multiple pre-peeling columns 24 and ejector pins 26 of the ejector tool. The vacuum enclosure 10 is fixed on a mounting base 48. The mounting base 48 is in turn mounted on the fixed base 56 of the assembly. There is a cavity 34 between the pin chuck 28 and the cylinder 30 containing the pre-peeling columns 26. It is in fluid communication with the central opening 16 and becomes a vacuum cavity when vacuum suction is applied via a vacuum opening 33 and vacuum channel 35 on the post 50 of the second actuator through the vacuum suction inlet 37 at its bottom as shown in FIG. 3.

The vacuum sealing of the cavity 34 is provided by (i) the adhesive film 42 and sealing ring 18 on the top of the vacuum enclosure 10, (ii) a vacuum enclosure sealing O-ring 36 towards the bottom of the vacuum enclosure 10, (iii) a cylinder base sealing O-ring 38 inside the mounting bracket 32 of the cylinder 30 containing the pre-peeling columns 24, (iv) a first actuator sealing O-ring 46 in-between the post 44 of the first actuator and the base mounting 48 of the vacuum enclosure 10, and (v) a second actuator sealing O-ring 52 in-between the post 50 of the second actuator and the post 44 of the first actuator.

Two pairs of magnets 54 are mounted at the bottom of the fixed base 56. One pair of magnets 54 is used for each linear motor. A moving coil 58 of the first linear motor is mounted to a linear guide 60 of the first actuator which is connected to the post 44 of the first actuator. Similarly, a moving coil 62 of the second linear motor is mounted to a linear guide 64 of the second actuator which is connected to the post 50 of the second actuator. A linear encoder (not shown) is preferably mounted on each linear guide 60, 64 to provide positional information of the actuator for servo control of the motor. Therefore, the elevating height of the ejector pins 26 and the pre-peeling columns 24 can be controlled separately and independently.

One pre-peeling process is now described with reference to FIGS. 4a and 4b. At the beginning of the die detachment process, the target die 40 carried on the adhesive film 42 is positioned to the center of the vacuum enclosure 10. A pickup collet 66 moves down and rests on top of the target die 40. It holds the target die in position by applying vacuum suction through its vacuum holes (not shown) on its bottom surface.

Figure 4A:
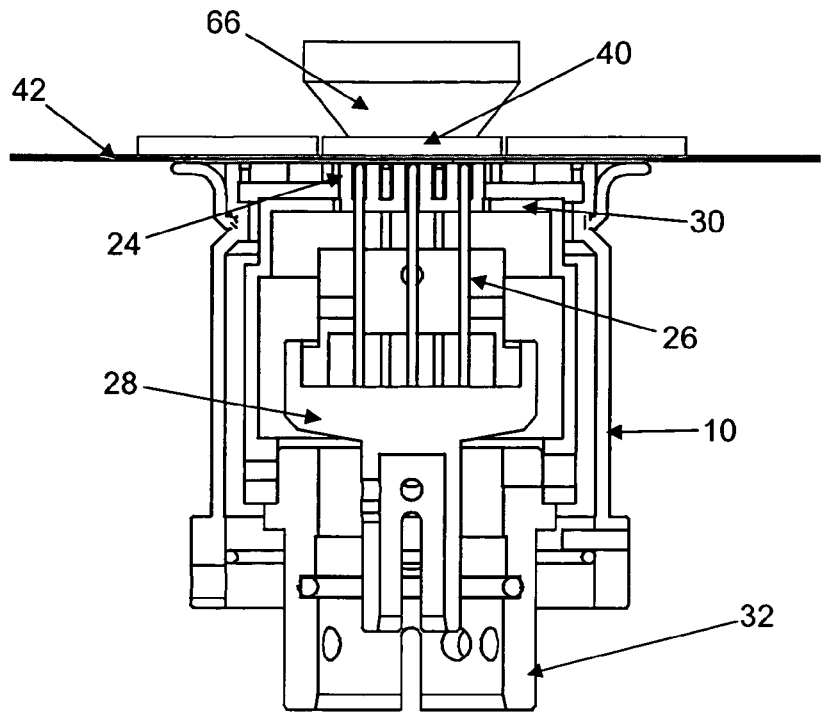
FIGS. 4a and 4b are cross-sectional views of the vacuum enclosure demonstrating a pre-peeling action facilitated by the pre-peeling structure.

The initial heights of the multiple pre-peeling columns 24 and the multiple ejector pins 26 are moved to a certain level such that their top surfaces are just below the top surface of the vacuum platform 12 as shown in FIG. 4a. Vacuum suction is applied to the vacuum enclosure 10 via the vacuum opening 33, vacuum channel 35 and the vacuum suction inlet 37 on the post 50 of the second actuator. The suction force through the central opening 16 and vacuum holes 14 on the vacuum platform 12 will pull the adhesive film 42 resting on the surface of the platform 12. The peripheral vacuum holes 22 inside the vacuum slot 20 together with the sealing ring 18 on top of the vacuum enclosure 10 provides sealing for building up the vacuum inside the vacuum enclosure 10 as well as along the interface between the bottom surface of the adhesive film 42 and the top surface of the vacuum platform 12.

Figure 4B:
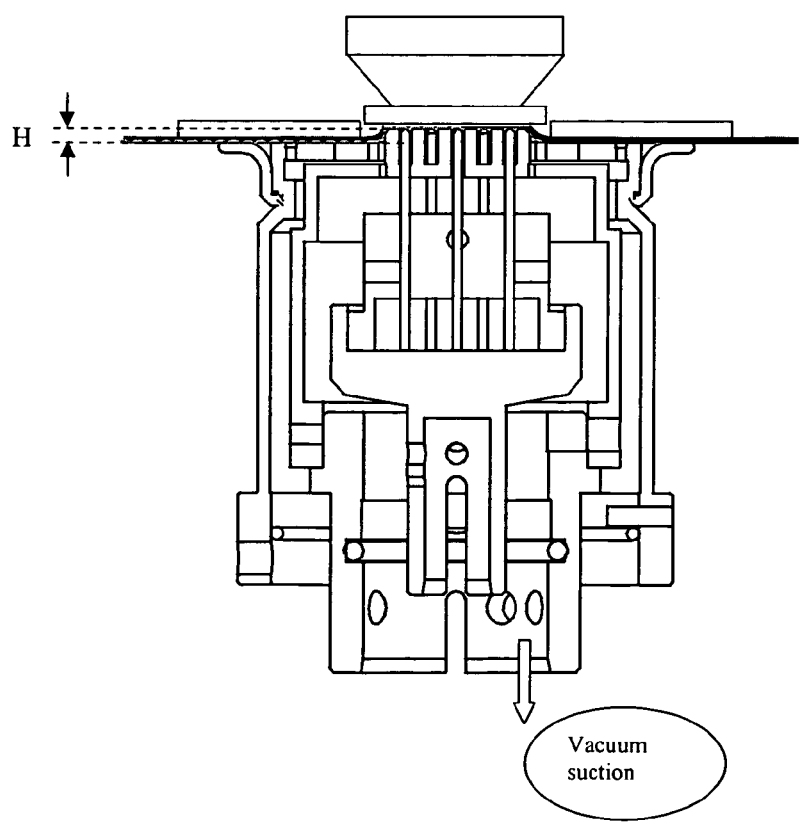

As soon as the vacuum level in the vacuum enclosure 10 reaches a suitable value (such as −70 to −90 kPa), the two movable stages will elevate at the same speed and lift the multiple pre-peeling columns 24 and multiple ejector pins 26 to the same height H above the top surface of the vacuum platform 12 as shown in FIG. 4b. The pickup collet 66 will also move up together with these ejector tools 24, 26 at the same speed and by the same distance. The pickup collet 66 moves up together with the ejector tool 24, 26 in order to minimize the compressive stress on the die 40.

The upward displacement of the pre-peeling columns 24 will create bending moments on the die 40 and these bending moments will produce peeling stress along the interface between the die 40 and the adhesive film 42. Since the columns 24 have flat-top surfaces providing a sufficiently large contact area, it will not introduce high localized stress on the die 40 as do the ejector pins 26. The spacings in-between the pre-peeling columns 24 allow the suction from within the vacuum enclosure 10 to pull the adhesive film 42 away from the die 40. The interfacial delamination between the die 40 and the adhesive film 42 initiates from the corners and edges of the die 40. This pre-peeling action will introduce partial delamination between the die 40 and the adhesive film 42. All four corners and edges should preferably be opened up by the end of a successful pre-peeling action.

The elevating speed and height H for the pre-peeling process are determined by the adhesive strength of the interface between the adhesive film 42 and the die 40. If the adhesive strength of the adhesive film 42 is not known, an optimized elevating speed and the height H of the multiple pre-peeling columns 24 for the pre-peeling process can be obtained by a measurement procedure as described below.

The force delivered by the linear motor is directly proportional to the magnitude of electrical current flowing in the coil 58, 62 of the linear motor in a given magnetic field provided by the magnets 54 for the linear motor. The magnitude of the upward force acting on the die 40 and the adhesive film 42 by the multiple pre-peeling columns 24 can be varied by changing the magnitude of the electrical current flowing through the coil 58 of the motor. The vacuum suction in the vacuum enclosure 10 will be turned on during this measurement procedure. The magnitude of the electrical current of the motor coil 58 is then gradually increased from zero to a programmable current limit to drive the motor to move upward. The current in the motor coil will be kept constant at this current limit.

The movable stage containing the multiple pre-peeling columns 24 will elevate and is stopped by the die 40 on the adhesive film 42. The maximum upward force provided by the multiple pre-peeling columns 24 will be determined by the said current limit. If the force provided by the multiple pre-peeling columns 24 is large enough for pre-peeling the die 40, the die 40 will be lifted to a certain height sufficient for the adhesive film 42 to delaminate from the die 40 starting from the four corners and edges of the die 40. Otherwise, the die 40 will buckle and the pre-peeling columns 24 will be stopped by the reaction force produced by the bending of the die 40 and the tension on the adhesive film 42.

Through re-programming the said current limit, the user is able to find the minimum current limit which is just large enough to perform pre-peeling for the die 40 without causing any die crack failure. The magnitude of the minimum current limit will increase with the adhesive strength of the adhesive film 42. When the linear motor is driven by this minimum current limit, the speed and maximum height of the multiple pre-peeling columns 24 provided by the first actuator can be measured by a linear encoder attached to the first actuator. By repeating these steps for the dice 40 at various locations on the wafer, the ranges of current limits, elevating speeds and maximum elevating heights can be obtained. One can take the minimum elevating speed and maximum elevating height of the measurement as the optimized elevating speed and height H for the pre-peeling action of the multiple pre-peeling columns 24. Hence, the optimized elevating speed and height H of the multiple pre-peeling columns 24 for the pre-peeling process may be obtained from these measurements.

Figure 5A:
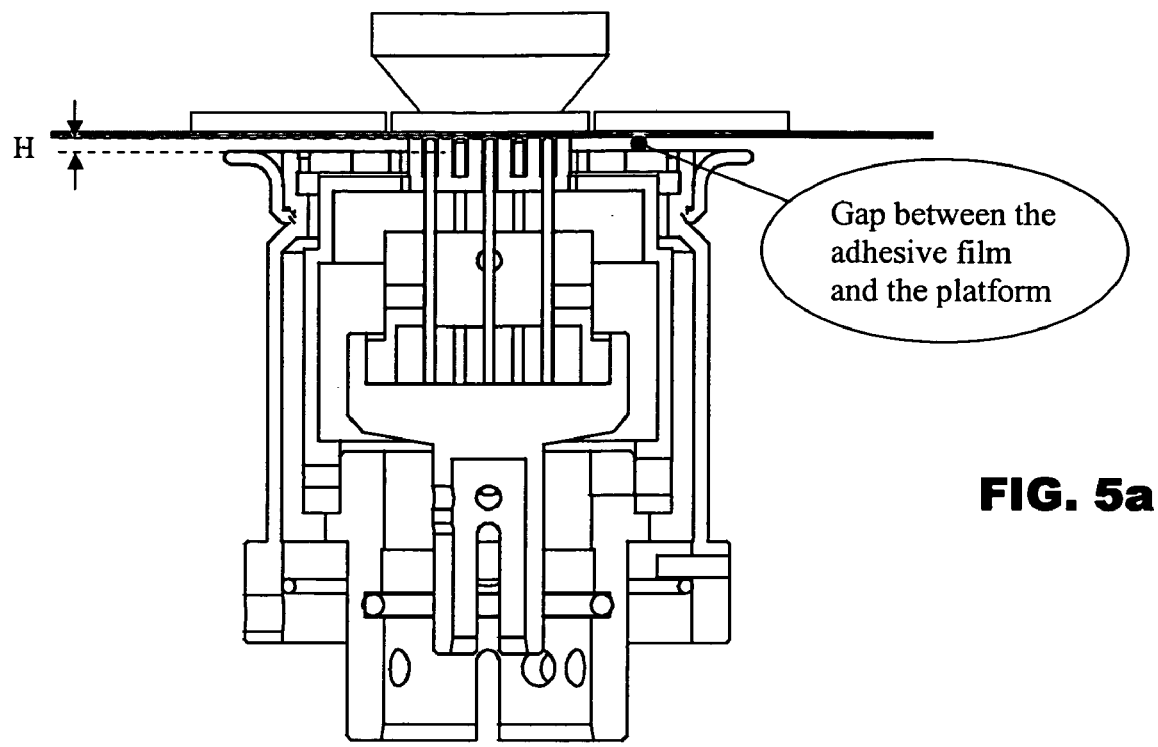
FIGS. 5a and 5b are cross-sectional views of the vacuum enclosure demonstrating an alternative pre-peeling action facilitated by the pre-peeling structure.
Figure 5B:
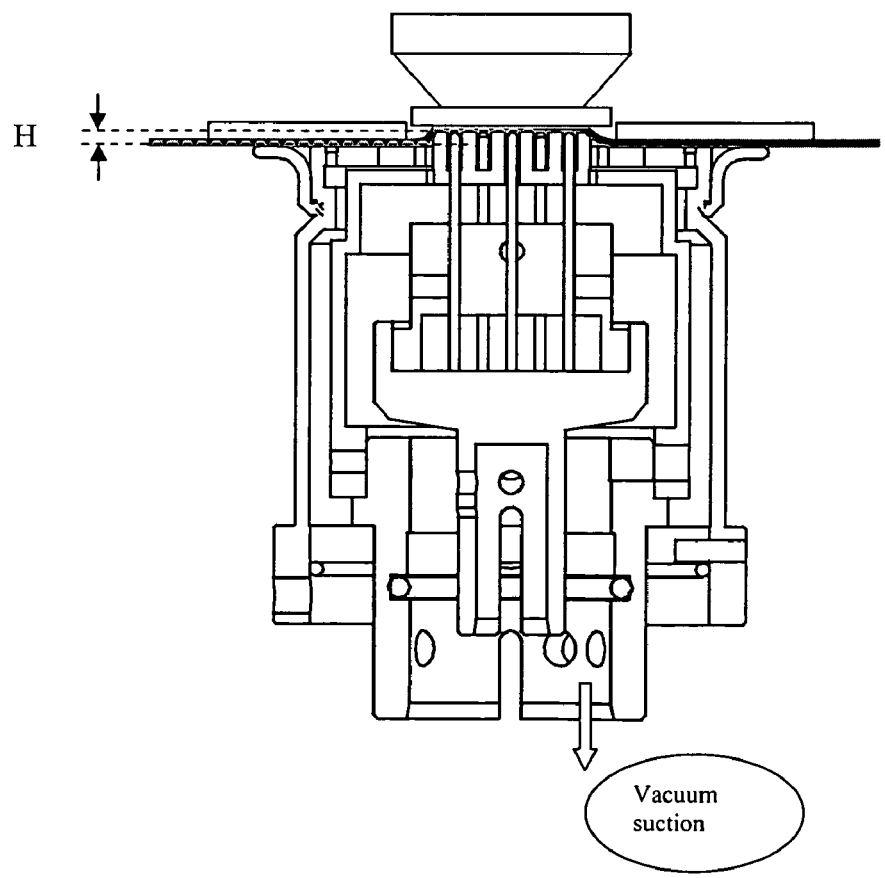

FIGS. 5a and 5b are cross-sectional views of the vacuum enclosure 10 demonstrating an alternative pre-peeling action facilitated by the pre-peeling structure. Before turning on the vacuum for the vacuum enclosure 10, the multiple pre-peeling columns 24 and multiple ejector pins 26 elevate to a height H above the surface of the vacuum platform 12. They can move at a relative higher speed since there is basically no reaction force acting on the die 40 and adhesive film 42 before the adhesive film 42 is tensioned by the vacuum suction on the platform 12 of the vacuum enclosure. The pre-peeling action will take place when the vacuum suction in the vacuum enclosure 10 is turned on. The gap between the adhesive film 42 and the vacuum platform 12 will close up when the vacuum suction is applied to vacuum enclosure 10. As this gap is closing up, the sealing ring 18 on top of the vacuum enclosure 10 can provide sealing for building up vacuum for an area bounded by the adhesive film 42 and the vacuum enclosure 10. The vacuum suction will pull the adhesive film 42 onto the platform 12 and the adhesive film 42 will be tensioned to conform to an elevated geometry formed by the multiple pre-peeling columns 24 and the multiple ejector pins 26. As the vacuum level inside the vacuum enclosure 10 reaches a suitable value (such as −70 to −90 kPa), the pre-peeling of the die 40 is realized and the die 40 will partially delaminate from the adhesive film 42 with all its corners and edges being separated from the adhesive film 42.

Figure 6A:
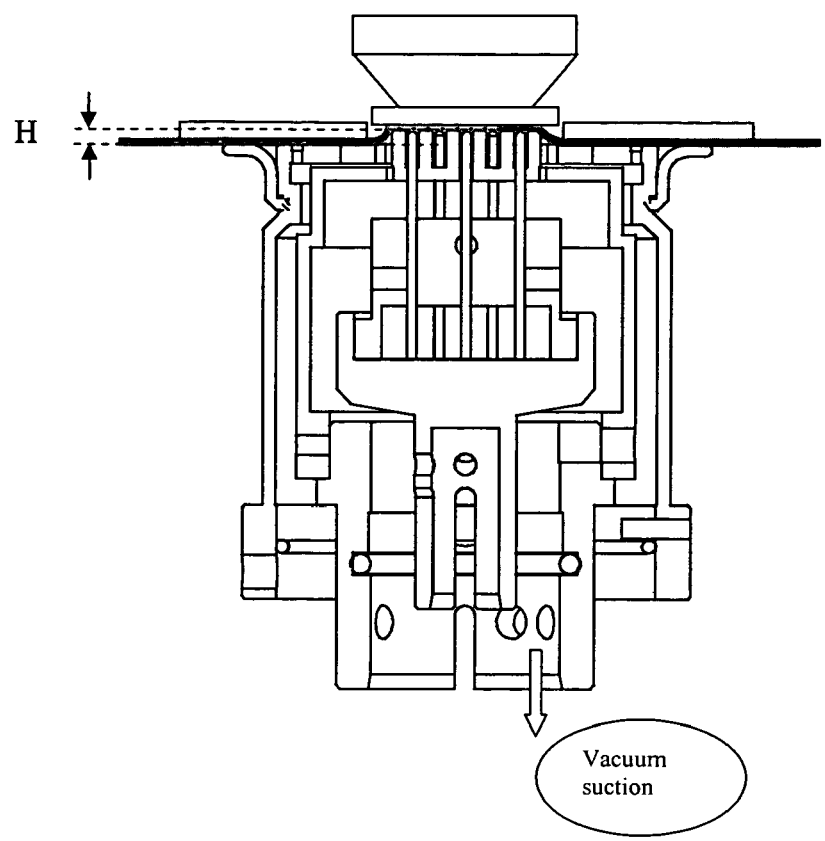
FIGS. 6a and 6b are cross-sectional views of the vacuum enclosure demonstrating a push-up action of the ejector pins together with retraction of the pre-peeling structure to complete a die detachment process.
Figure 6B:
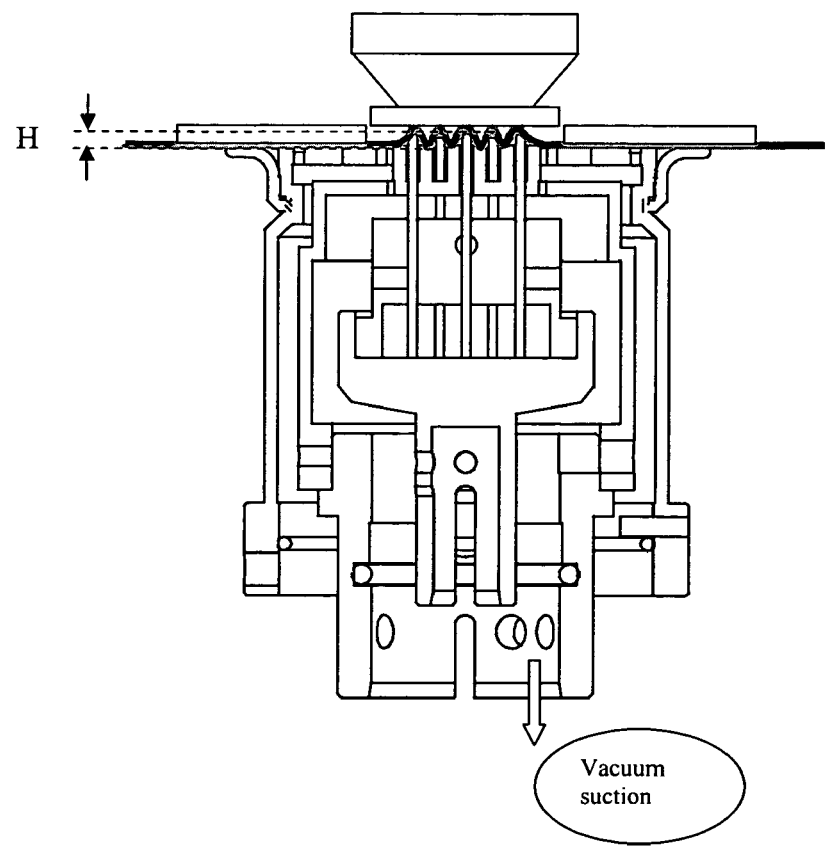

The next step of the die detachment process is the elevation of the multiple ejector pins 26 relative to the pre-peeling columns 24 to further the delamination between the die 40 and the adhesive film 42. FIGS. 6a and 6b are cross-sectional views of the vacuum enclosure 10 demonstrating a push-up action of the ejector pins 26 together with retraction of the pre-peeling structure 24 to complete a die detachment process. The status of the die 40 and the ejector tool 24, 26 just after the pre-peeling action is shown in FIG. 6a. Meanwhile, the vacuum suction in the vacuum enclosure 10 is still turned on. There are three preferred methods comprising different motion sequences of the ejector tool 24, 26 for furthering the delamination. The simplest method is shown in FIG. 6b wherein the multiple pre-peeling columns 24 will retract and move down to a level below the top surface of vacuum platform 12 at a programmable speed and the multiple ejector pins 26 are still maintained at the height H above the surface of the vacuum platform 12. Since the multiple pre-peeling columns 24 are retracted, the delamination of the adhesive film 42 can propagate further into the die 40 until the delamination process is completed.

Figure 7A:
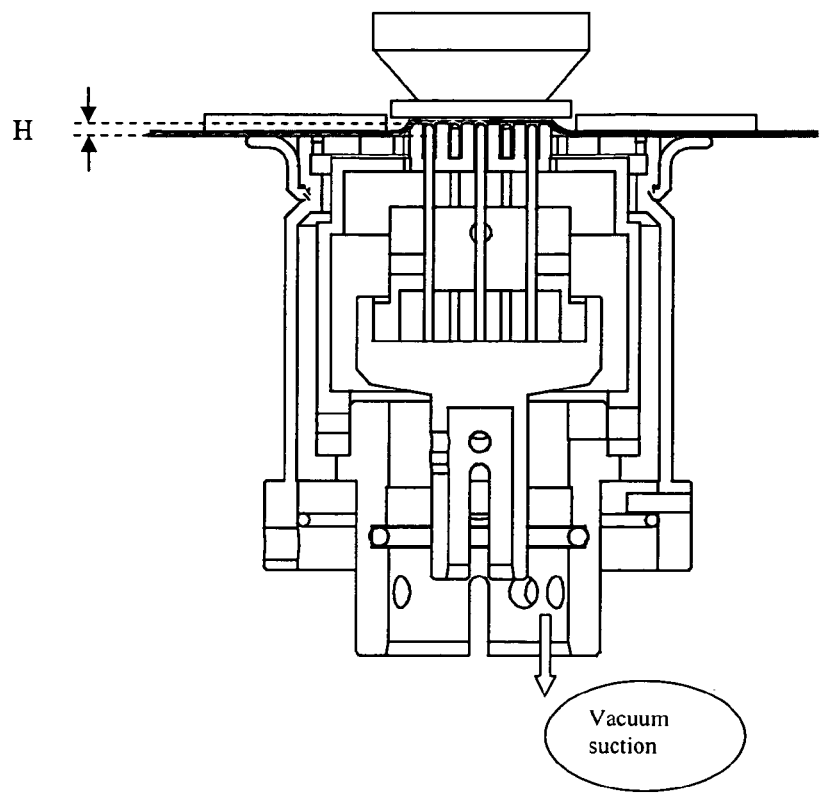
FIGS. 7a and 7b are cross-sectional views of the vacuum enclosure demonstrating a push-up action of the ejector pins to a higher position without retraction of the pre-peeling structure to complete a die detachment process.
Figure 7B:
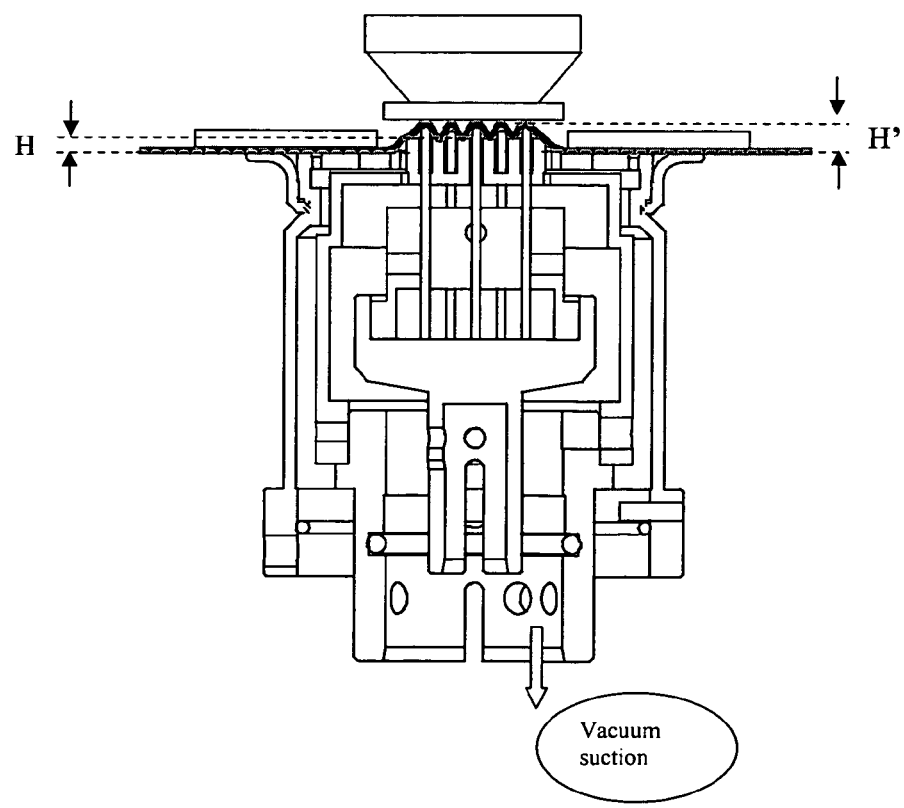

A second method adopting an alternative motion sequence of the ejector tool 24, 26 is shown in FIG. 7b. This motion sequence can be performed by moving the multiple ejector pins 26 further up to a height H' above the vacuum platform 12 without retracting the multiple pre-peeling columns 24 which are still maintained at the same height H as before. When the multiple ejector pins 26 move further up, the delamination process between the die 40 and the adhesive film 42 will continue until it is completed provided that the height H' is high enough.

Figure 8A:
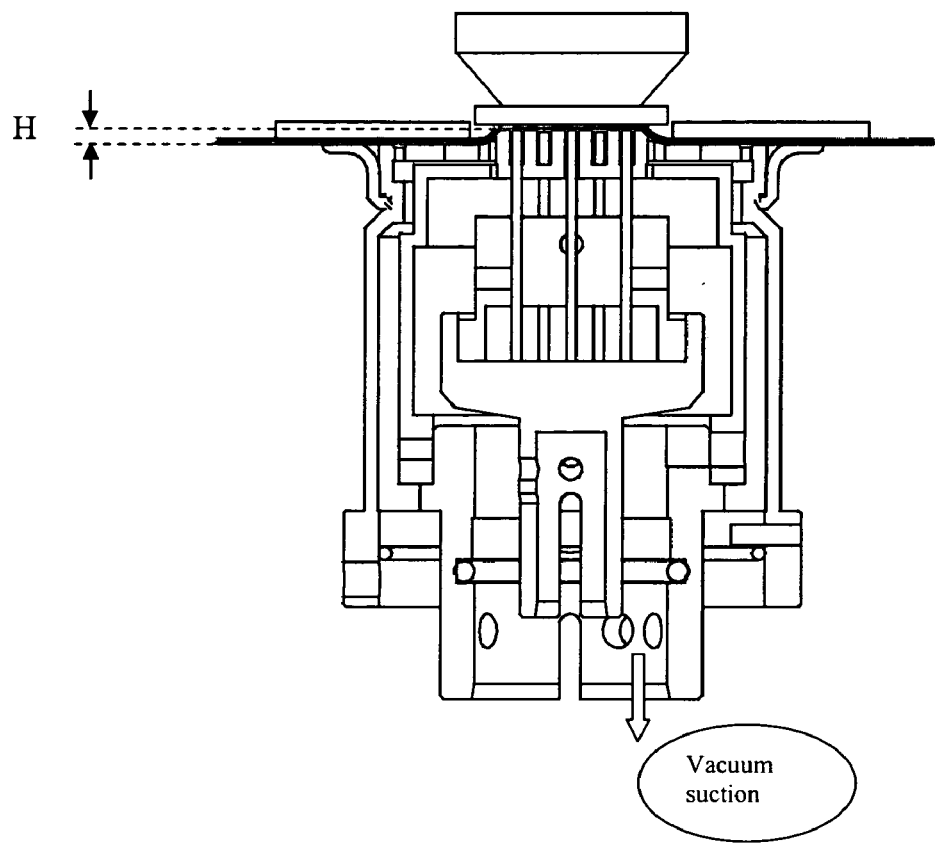
FIGS. 8a and 8b are cross-sectional views of the vacuum enclosure demonstrating a push-up action of the ejector pins to a higher position together with retraction of the pre-peeling structure to complete a die detachment process.
Figure 8B:
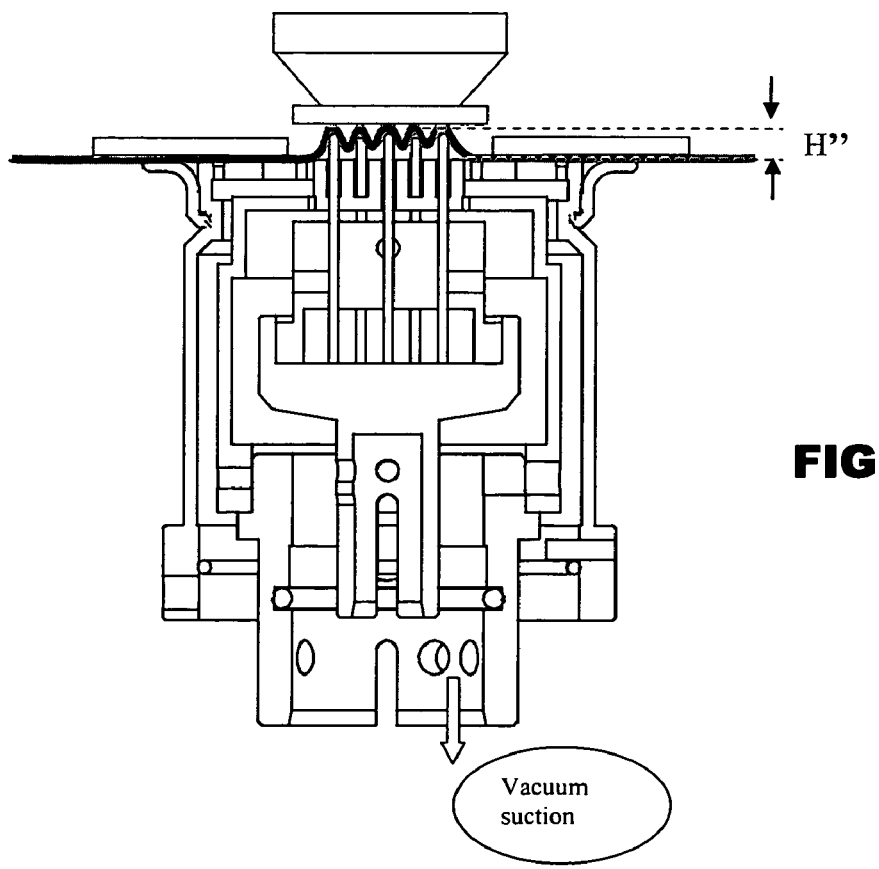

A third possible method to complete the delamination process between the die 40 and the adhesive film 42 is shown in FIG. 8b wherein the multiple pre-peeling columns 24 retract and move down to a level below the vacuum platform 12 at a programmable speed, and the multiple ejector pins 26 move further up together with the pickup collet 66 also at a programmable speed to a height H" above the vacuum platform 12. These two actions allow the interfacial delamination between the die 40 and adhesive film 42 to propagate until the delamination process is completed.

At the end of the delamination process, the die 40 is supported only by the multiple ejector pins 26, and the residual contact area between the die 40 and the adhesive film 42 will be minimal. Therefore, the die 40 is readily picked up by the vacuum collet 66. The collet 66 will pick up the die 40 through vacuum suction at its center (not shown) and move it to the next process location. The multiple ejector pins 26 will retract and the multiple pre-peeling columns 24 will move back to a level just below the surface of the vacuum platform 12. The vacuum suction in the vacuum enclosure 10 will be turned off and the die detachment process is completed.

It would be appreciated that the invention combines the advantages of using both a needleless pre-peeling structure and ejector pins comprising needles for detaching a die from an adhesive film. The pre-peeling structure constructed by multiple pre-peeling columns provides effective pre-peeling to the corners and edges of the die in the beginning of the detachment process. By using columns with relatively larger top surfaces as compared to ejector pins, the compressive localized stress on the die induced by the push-up action of the columns will be small. In addition, the partial delamination around the periphery of the pre-peeling columns is further enhanced by the spacings in-between the pre-peeling columns.

Since a significant contact area between the die and adhesive film has already been delaminated by the push-up action of the pre-peeling columns, minimal numbers of pins can be used to push the die further up to complete the interfacial delamination. Hence, the residual contact area between the die and the adhesive film will be minimal at the end of the push-up action of the pre-peeling columns and then the multiple ejector pins. A further advantage is that the two linear actuators driving the stages supporting the ejector tool can also lift the stages to their pre-determined heights independently at various speeds as needed by the delamination process. The actuation sequence of the needleless pre-peeling structure and the multiple ejector pins can be re-programmed as needed to optimize the speed and preformance of the detachment process for various sizes and thickness of the die and adhesive strength of the adhesive film.

The invention described herein is susceptible to variations, modifications and/or additions other than those specifically described and it is to be understood that the invention includes all such variations, modifications and/or additions which fall within the spirit and scope of the above description.

The invention claimed is:

1. An apparatus for detaching a die positioned at a position of the apparatus from an adhesive film to which the die is attached, the apparatus comprising:
   a vacuum enclosure having a surface configured to support a part of the adhesive film;
   a plurality of pre-peeling columns positioned at the vacuum enclosure, the plurality of pre-peeling columns comprising flat contact surfaces parallel to the surface of the vacuum enclosure and configured to support the part of the adhesive film, the plurality of pre-peeling columns being configured to be projected relative to the surface of the vacuum enclosure to push against the adhesive film at the position of the apparatus to generate initial peeling between the die and the adhesive film; and
   a plurality of ejector pins positionable relative to the plurality of pre-peeling columns and configured to be pushed up against the adhesive film at the position to generate further peeling between the die and the adhesive film prior to removal of the die from the adhesive film, each pin of the plurality of ejector pins comprising a contact surface different from the flat contact surfaces of the pre-peeling columns in that the contact surface of each pin is pointed compared with the flat contact surfaces of the pre-peeling columns.

2. The apparatus as claimed in claim 1, wherein the plurality of pre-peeling columns is arranged in a matrix configuration.

3. The apparatus as claimed in claim 1, including an opening on the surface of the vacuum enclosure sized and configured to allow both the plurality of pre-peeling columns and the plurality of ejector pins to project from underneath the surface of the vacuum enclosure to push against the adhesive film.

4. The apparatus as claimed in claim 3, wherein the opening has a shape that corresponds to a shape of the die that is to be detached.

5. The apparatus as claimed in claim 3, wherein the opening is configured to apply a vacuum suction force on the adhesive film.

6. The apparatus as claimed in claim 5, further comprising a vacuum cavity positioned underneath the surface of the vacuum enclosure and in fluid communication with the opening for applying the vacuum suction force at the opening.

7. The apparatus as claimed in claim 1, further comprising a first stage for mounting the plurality of pre-peeling columns and a second stage for mounting the plurality of ejector pins, the first stage and the second stage being independently driven by actuators.

8. The apparatus as claimed in claim 7, further comprising linear actuators coupled to the first stage and the second stage, respectively, for separately driving the plurality of pre-peeling columns and the plurality of ejector pins.

9. The apparatus as claimed in claim 8, wherein the linear actuators comprise linear servo motors.

10. The apparatus as claimed in claim 8, wherein the linear actuators are programmable for controlling motion sequences, motion speeds and heights of the first stage and the second stage during operation.

11. The apparatus as claimed in claim 1, wherein edges of outermost pre-peeling columns of the plurality of pre-peeling columns are configured to be positioned at corners of the die during peeling.

12. The apparatus as claimed in claim 11, wherein outer edges of the outermost pre-peeling columns are configured to be positioned 0.3 mm to 1 mm from edges of the die during peeling.

* * * * *